United States Patent
Tang et al.

(10) Patent No.: US 9,256,522 B1
(45) Date of Patent: Feb. 9, 2016

(54) METHOD AND SYSTEM FOR GENERATING SOFT-INFORMATION AFTER A SINGLE READ IN NAND FLASH USING EXPECTED AND MEASURED VALUES

(71) Applicant: SK hynix memory solutions inc., San Jose, CA (US)

(72) Inventors: Xiangyu Tang, San Jose, CA (US); Lingqi Zeng, Turlock, CA (US); Jason Bellorado, San Jose, CA (US); Frederick K. H. Lee, Mountain View, CA (US); Arunkumar Subramanian, Santa Clara, CA (US)

(73) Assignee: SK Hynix memory solutions inc., San Jose, CA (US)

( * ) Notice: Subject to any disclaimer, the term of this patent is extended or adjusted under 35 U.S.C. 154(b) by 337 days.

(21) Appl. No.: 13/858,781

(22) Filed: Apr. 8, 2013

Related U.S. Application Data

(60) Provisional application No. 61/635,653, filed on Apr. 19, 2012.

(51) Int. Cl.
*G06F 12/02* (2006.01)
*G06F 11/10* (2006.01)
*G06F 11/00* (2006.01)
*G11C 16/34* (2006.01)
*G11C 16/26* (2006.01)
*G06F 12/00* (2006.01)

(52) U.S. Cl.
CPC ............ *G06F 12/00* (2013.01); *G06F 11/1072* (2013.01); *G06F 12/0246* (2013.01); *G11C 16/26* (2013.01); *G11C 16/34* (2013.01); *G06F 11/008* (2013.01); *G06F 2212/1032* (2013.01); *G06F 2212/2022* (2013.01)

(58) Field of Classification Search
CPC ............... G11C 16/26; G06F 12/0246; G06F 2212/1032; G06F 2212/2022
See application file for complete search history.

(56) References Cited

U.S. PATENT DOCUMENTS

| | | | |
|---|---|---|---|
| 2011/0225350 A1* | 9/2011 | Burger, Jr. et al. | 711/103 |
| 2011/0305082 A1* | 12/2011 | Haratsch et al. | 365/185.03 |
| 2012/0134207 A1* | 5/2012 | Yoon et al. | 365/185.03 |
| 2014/0040531 A1* | 2/2014 | Wu et al. | 711/103 |
| 2014/0164865 A1* | 6/2014 | Sharon et al. | 714/752 |

* cited by examiner

*Primary Examiner* — Tuan Thai
*Assistant Examiner* — Glenn Gossage
(74) *Attorney, Agent, or Firm* — IP & T Group LLP

(57) ABSTRACT

A system and method for determining soft read data for a group of cells in a nonvolatile flash memory are disclosed. An expected value representative of a plurality of stored values in a group of cells is obtained. A measured value representative of the plurality of stored values in the group of cells is obtained, based on a single read to the group of cells. A soft read data for the group of cells is determined based at least in part on the expected value and the measured value. The expected and measured values may include at least one of a number of 0s, a number of 1s, a ratio of 0s to 1s or a ratio of 1s to 0s. A reliability for a bit i may be obtained using a one-step majority logic decoder, and a threshold reliability may be used when determining the soft read data.

16 Claims, 10 Drawing Sheets

METHOD AND SYSTEM FOR GENERATING SOFT-INFORMATION AFTER A SINGLE READ IN NAND FLASH USING EXPECTED AND MEASURED VALUES

CROSS REFERENCE TO OTHER APPLICATIONS

This application claims priority to U.S. Provisional Patent Application No. 61/635,653 entitled GENERATING SOFT-INFORMATION AFTER A SINGLE READ IN NAND FLASH filed Apr. 19, 2012 which is incorporated herein by reference for all purposes.

BACKGROUND OF THE INVENTION

Solid state storage systems (such as NAND Flash storage) do not natively return soft values when read. When a read is performed on NAND Flash storage, a read threshold is specified. Cells in a page having a voltage lower than the read threshold are reported as having a first hard read value (e.g., a 1) and cells in the page having a voltage higher than the read threshold are reported as having a second hard read value (e.g., a 0). Although techniques exist to generate soft read data from two or more reads, generating soft read data from a single read is more attractive (e.g., because it consumes less power and fewer input/output (I/O) resources). Better quality soft read data would, for example, improve various system performance measurements, such as bit error rate or sector failure rate.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
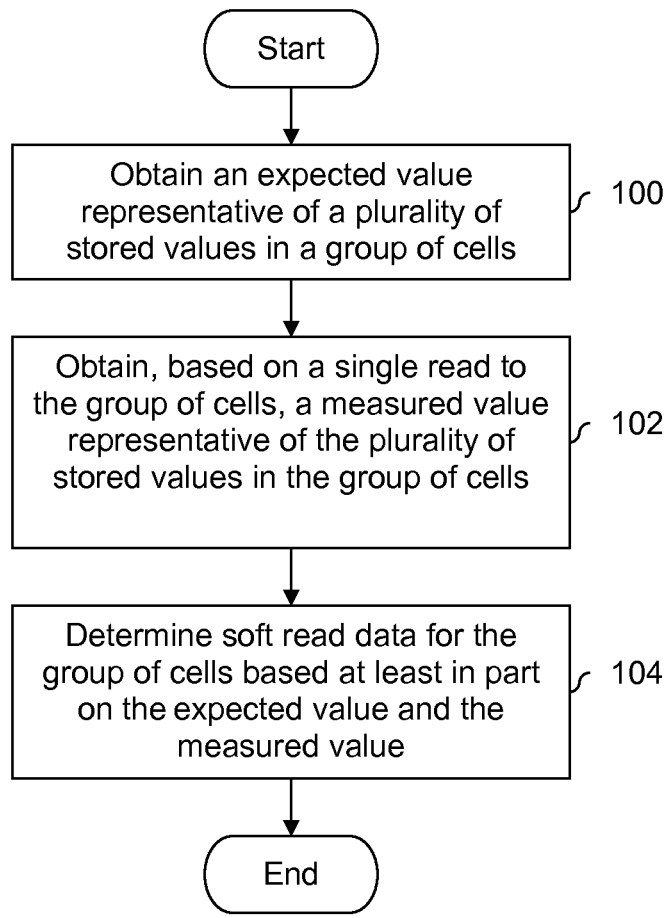
FIG. 1 is a flowchart illustrating an embodiment of a process for generating soft read data for a group of cells from a single read.

FIG. 1 is a flowchart illustrating an embodiment of a process for generating soft read data for a group of cells from a single read. In the example shown, a group of cells (e.g., a page) in solid state storage (e.g., NAND Flash) is read and soft read data for each of the cells in the group are generated from that single read. In some examples described herein, soft read data comprises a log-likelihood ratio (LLR) where the sign (e.g., + or −) corresponds to a decision (e.g., a 1 or a 0) and the magnitude corresponds to a likelihood, certainty, or probability associated with that decision. For example, a larger magnitude may indicate a stronger certainty in the corresponding decision for a given cell. Although LLR examples are described herein, any type of soft data or representation may be used.

At step 100 in FIG. 1, an expected value representative of a plurality of stored values in a group of cells is obtained. In one example, when a page is written, an expected value representative of the plurality of stored values written to that page is stored in some table or memory and step 100 includes accessing that table or memory and obtaining the stored value. In various embodiments, an expected value obtained at step 100 includes a number of 0s written to a page, a number of 1s written to a page, a ratio of 0s to 1s written to a page, or a ratio of 1s to 0s written to a page.

At step 102, a measured value representative of the plurality of stored values in the group of cells is obtained based on a single read to the group of cells. For example, a single read of a page is performed in order to obtain hard read data. In various embodiments, a measured value comprises a number of 0s read back from the page, a number of 1s read back from the page, a ratio of 0s to 1s read back from the page, or a ratio of 1s to 0s read back from the page based on the hard read data. The technique described herein is independent of how a read threshold (e.g., used at step 102 to perform the read) is generated and any appropriate read threshold generation technique or optimal read threshold estimation technique may be used.

Soft read data for the group of cells is determined based at least in part on the expected value and the measured value at step 104. In some embodiments, cells which are interpreted to have a certain bit value (e.g., a 0 or a 1) are assigned the same LLR value (e.g., the same $LLR_0$ value or the same $LLR_1$ value). In some embodiments, a first cell, which is interpreted to have a certain bit value (e.g., a 0 or a 1), is assigned a different LLR value than another cell which is also interpreted to have the same bit value. For example, a first cell may be assigned an $LLR_1$ value of $LLR_1^{-1}$ and a second cell may be assigned an $LLR_1$ value of $LLR_1^{-2}$. Various embodiments of step 104 are described in further detail below.

Figure 2:
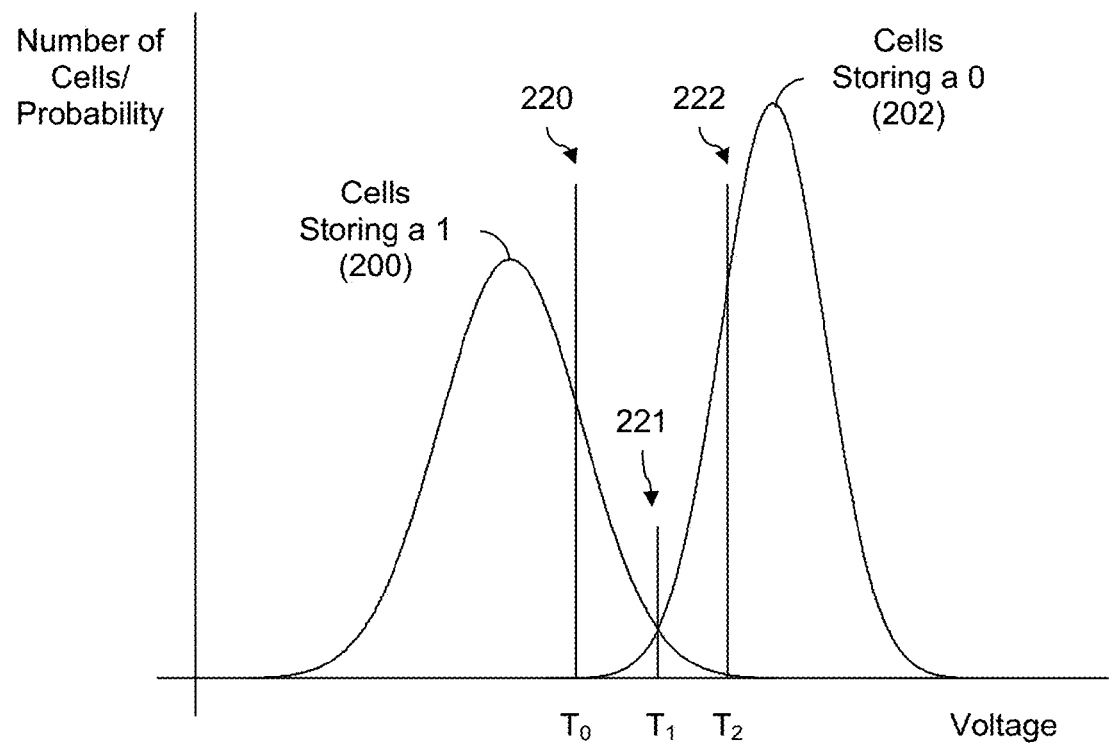
FIG. 2 is a diagram showing an embodiment of distributions associated with a group of cells.

FIG. 2 is a diagram showing an embodiment of distributions associated with a group of cells. In the example shown, distribution 200 is associated with cells which (actually) store a 1 and distribution 202 is associated with cells which (actually) store a 0. In various embodiments, the y-axis shown corresponds to the number of cells storing a given voltage (e.g., as in a histogram) or a probability (e.g., as in a probability distribution function). Although examples described herein assume that lower voltages correspond to a bit value of 1 and higher voltages correspond to a bit value of 0 (as shown in this example), this is not intended to be limiting and any relationship between voltage and bit values may be used.

In the example shown, three example read thresholds are shown: $T_0$ (220), $T_1$ (221), and $T_2$ (222), where $T_0 < T_1 < T_2$. $T_1$ (221) corresponds to the crossing point of distributions 200 and 202 and is referred to as an optimal read threshold because it returns read data corresponding to the fewest number of bit errors (i.e., it minimizes the sum of the number of cells which actually store a 1 but which are read as a 0 plus the number of cells which actually store a 0 but which are read as a 1).

If reads are performed at read thresholds 220-222, the values shown in Table 1 would be obtained. As used herein, Z refers to a number of 0s (e.g., read at a particular read threshold, expected, measured, etc.), O refers to a number of 1s (e.g., read at a particular read threshold, expected, measured, etc.), RZO refers to a ratio of 0s to 1s (e.g., read at a particular read threshold, expected, measured, etc.), and ROZ refers to a ratio of 1s to 0s (e.g., read at a particular read threshold, expected, measured, etc.).

TABLE 1

Example ordering of values for FIG 2.

| | Ordering of Values Associated with Read Thresholds $T_0$, $T_1$, and $T_2$ |
|---|---|
| Number of 0s Read | $Z_{T0} > Z_{T1} > Z_{T2}$ |
| Number of 1s Read | $O_{T0} < O_{T1} < O_{T2}$ |
| Ratio of 0s to 1s Read | $RZO_{T0} > RZO_{T1} > RZO_{T2}$ |
| Ratio of 1s to 0s Read | $ROZ_{T0} < ROZ_{T1} < ROZ_{T2}$ |

The orderings (i.e., ascending/descending order) of values in Table 1 may be determined by noting the following. As the read threshold increases (i.e., $T_0 \rightarrow T_1 \rightarrow T_2$), there is an increasing number of cells from distribution 200 (i.e., cells storing a 1) and from distribution 202 (i.e., cells storing a 0) which are to the left of read thresholds $T_0$, then $T_1$, and then $T_2$. As a result, as the read threshold increases, the number of cells interpreted to have a 1 increases. This ordering is shown in the second row of Table 1. Conversely, the number of cells interpreted to have a 0 decreases as the read threshold increases because fewer cells are to the right of the read threshold as the read threshold increases from $T_0$ to $T_1$ to $T_2$. This relationship or ordering is shown in the first row of Table 1. The ordering of ratios (i.e., $RZO_{T0} > RZO_{T1} > RZO_{T2}$ and $ROZ_{T0} < ROZ_{T1} < ROZ_{T2}$) falls out from the ordering $Z_{T0} > Z_{T1} > Z_{T2}$ and $O_{T0} < O_{T1} < O_{T2}$.

Examination of Table 1 yields further insights when various expected and measured values are compared and these insights are shown in Table 2. As used herein, RT refers to a read threshold (e.g., associated with an expected value or a measured value), $LLR_0$ refers to an LLR value associated with cell(s) associated with a 0 (e.g., an LLR value assigned to cells which are interpreted as having a 0) and $LLR_1$ refers to an LLR value associated with cell(s) associated with a 1 (e.g., an LLR value assigned to cells which are interpreted as having a 1).

TABLE 2

Example comparison of expected and measured values.

| | Comparison of Expected and Measured Values | Comparison of Read Thresholds associated with Expected and Measured Values | Adjustment to (e.g., Nominal or Default) Magnitude of LLR |
|---|---|---|---|
| Number of 0s | $Z_{exp} > Z_{meas}$ | $RT_{meas} > RT_{exp}$ | For $LLR_0$, increase magnitude. For $LLR_1$, decrease magnitude. |
| | $Z_{exp} \approx Z_{meas}$ | $RT_{meas} \approx RT_{exp}$ | For $LLR_0$, no change to magnitude. For $LLR_1$, no change to magnitude. |
| | $Z_{exp} < Z_{meas}$ | $RT_{meas} < RT_{exp}$ | For $LLR_0$, decrease magnitude. For $LLR_1$, increase magnitude. |
| Number of 1s | $O_{exp} > O_{meas}$ | $RT_{meas} < RT_{exp}$ | For $LLR_0$, decrease magnitude. For $LLR_1$, increase magnitude. |
| | $O_{exp} \approx O_{meas}$ | $RT_{meas} \approx RT_{exp}$ | For $LLR_0$, no change to magnitude. For $LLR_1$, no change to magnitude. |
| | $O_{exp} < O_{meas}$ | $RT_{meas} > RT_{exp}$ | For $LLR_0$, increase magnitude. For $LLR_1$, decrease magnitude. |
| Ratio of 0s to 1s | $RZO_{exp} > RZO_{meas}$ | $RT_{meas} > RT_{exp}$ | For $LLR_0$, increase magnitude. For $LLR_1$, decrease magnitude. |
| | $RZO_{exp} \approx RZO_{meas}$ | $RT_{meas} \approx RT_{exp}$ | For $LLR_0$, no change to magnitude. For $LLR_1$, no change to magnitude. |
| | $RZO_{exp} < RZO_{meas}$ | $RT_{meas} < RT_{exp}$ | For $LLR_0$, decrease magnitude. For $LLR_1$, increase magnitude. |
| Ratio of 1s to 0s | $ROZ_{exp} > ROZ_{meas}$ | $RT_{meas} < RT_{exp}$ | For $LLR_0$, decrease magnitude. For $LLR_1$, increase magnitude. |

TABLE 2-continued

Example comparison of expected and measured values.

| Comparison of Expected and Measured Values | Comparison of Read Thresholds associated with Expected and Measured Values | Adjustment to (e.g., Nominal or Default) Magnitude of LLR |
|---|---|---|
| $ROZ_{exp} \approx ROZ_{meas}$ | $RT_{meas} \approx RT_{exp}$ | For $LLR_0$, no change to magnitude. For $LLR_1$, no change to magnitude. |
| $ROZ_{exp} < ROZ_{meas}$ | $RT_{meas} > RT_{exp}$ | For $LLR_0$, increase magnitude. For $LLR_1$, decrease magnitude. |

In the first row in Table 2, $Z_{exp}$ and $Z_{meas}$ are compared and $Z_{exp} > Z_{meas}$. The second column from the right describes whether a read threshold associated with a measured value is to the right (i.e., greater than) or to the left (i.e., less than) of a read threshold associated with an expected value. If the expected value (in this example, $Z_{exp}$) is associated with optimal read threshold 221 in FIG. 2, then read thresholds 220 and 222 represent the two possibilities (i.e., that the read threshold associated with a measured value is greater than or less than a read threshold associated with an expected value). For the case where $Z_{exp} > Z_{meas}$, the read threshold associated with the measured value $Z_{meas}$ is i greater than the optimal read threshold (i.e., $Z_{meas} \leftrightarrow$ read threshold 222 when $Z_{exp} > Z_{meas}$). This is because when going from optimal read threshold 221 to read threshold 222, the number of 0s read back decreases (i.e., because fewer cells in distributions 200 and 202 are to the right of read threshold 222 compared to when optimal read threshold 221 is used); this corresponds to the relationship where $Z_{exp}$ is greater than $Z_{meas}$.

Figure 3:
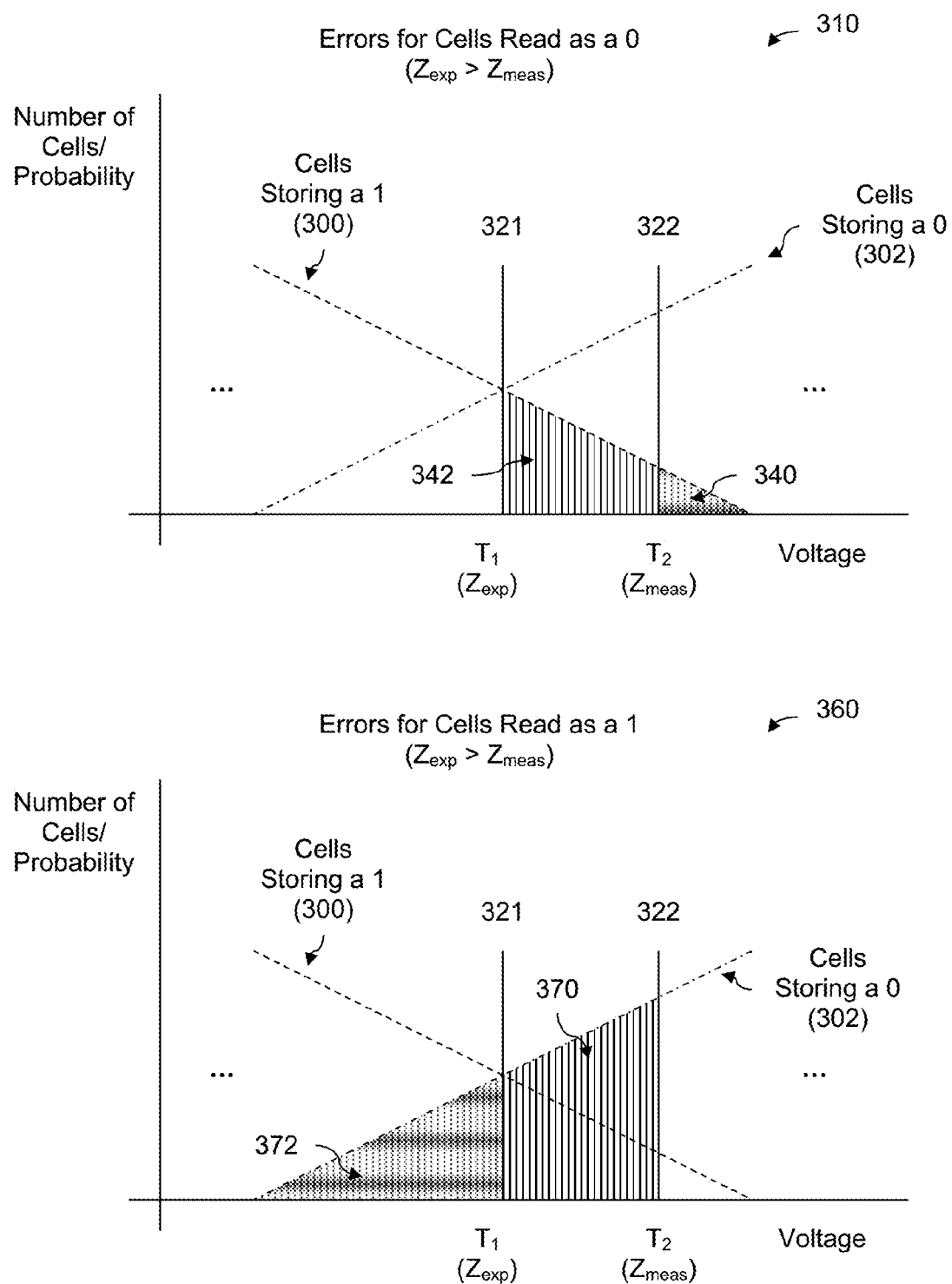
FIG. 3 is a diagram showing read errors in one embodiment.

The rightmost column in Table 2 relates to adjustments to a nominal or default magnitude of an LLR value. FIG. 3 is a diagram showing read errors in one embodiment. In this example, the case where $Z_{exp} > Z_{meas}$ is shown so that optimal read threshold 321 corresponds to $Z_{exp}$ and read threshold 322 corresponds to $Z_{meas}$. Diagram 310 shows errors for cells read back as a 0 and diagram 360 shows errors for cells read back as a 1. For clarity, distributions 300 and 302 are shown "zoomed in" and portions of the distributions which do not affect the relevant errors are not shown. Also for clarity, distribution 300 (i.e., cells which actually store a 1) is shown with a dashed line and distribution 302 (i.e., cells which actually store a 0) is shown with a dashed and dotted line.

In diagram 310, when optimal read threshold 321 (corresponding to $Z_{exp}$) is used to perform a read, the cells which actually store a 1 but which are interpreted as a 0 (i.e., errors for cells read as a 0) are represented by error region 342 with vertical lines. When read threshold 322 (corresponding to $Z_{meas}$) is used to perform a read, the cells which actually store a 1 but which are interpreted as a 0 are represented by error region 340 with horizontal lines.

The relative areas of error regions 340 and 342 (i.e., the area of error region 342>the area of error region 340) suggests that for cells which are read back as a 0, a nominal or default magnitude for an $LLR_0$ value should be increased. Put another way, for the case where $Z_{exp} > Z_{meas}$, if a cell is interpreted to have a 0 (i.e., using read threshold 322), that interpretation has reduced probability of being one of the incorrectly interpreted ones and thus it may be desirable to increase a nominal or default likelihood for that case. This corresponds to increasing a nominal or default magnitude of $LLR_0$, as is shown in the rightmost column in the first row in Table 2.

Diagram 360 shows errors for cells read as a 1 when $Z_{exp} > Z_{meas}$. In this example, cells which actually store a 0 and which are incorrectly interpreted as a 1 when optimal read threshold 321 is used are shown in error region 372 with horizontal lines. Error region 370 (shown with vertical lines) represents cells which actually store a 0 and which are incorrectly interpreted as a 1 when read threshold 322 is used. Thus, when going from $Z_{exp}$ to $Z_{meas}$, the number of errors for cells interpreted as a 1 has increased. As such, this suggests a decrease to a nominal or default magnitude of $LLR_1$ for this case, as is shown in the first row, rightmost column in Table 2, since the likelihood of an incorrectly interpreted 1 has increased.

Returning to Table 2, for the case where $Z_{exp} \approx Z_{meas}$, the read threshold associated with the measured value is fairly close to the read threshold associated with the optimal read threshold. As such, this suggests no change to a default or nominal $LLR_0$ or $LLR_1$ magnitude. The rest of Table 2 may be populated using similar reasoning to that described above.

The following figures show an example where some of the observations shown in Table 2 are used to generate soft read data based at least in part on an expected value and a measured value.

Figure 4A:
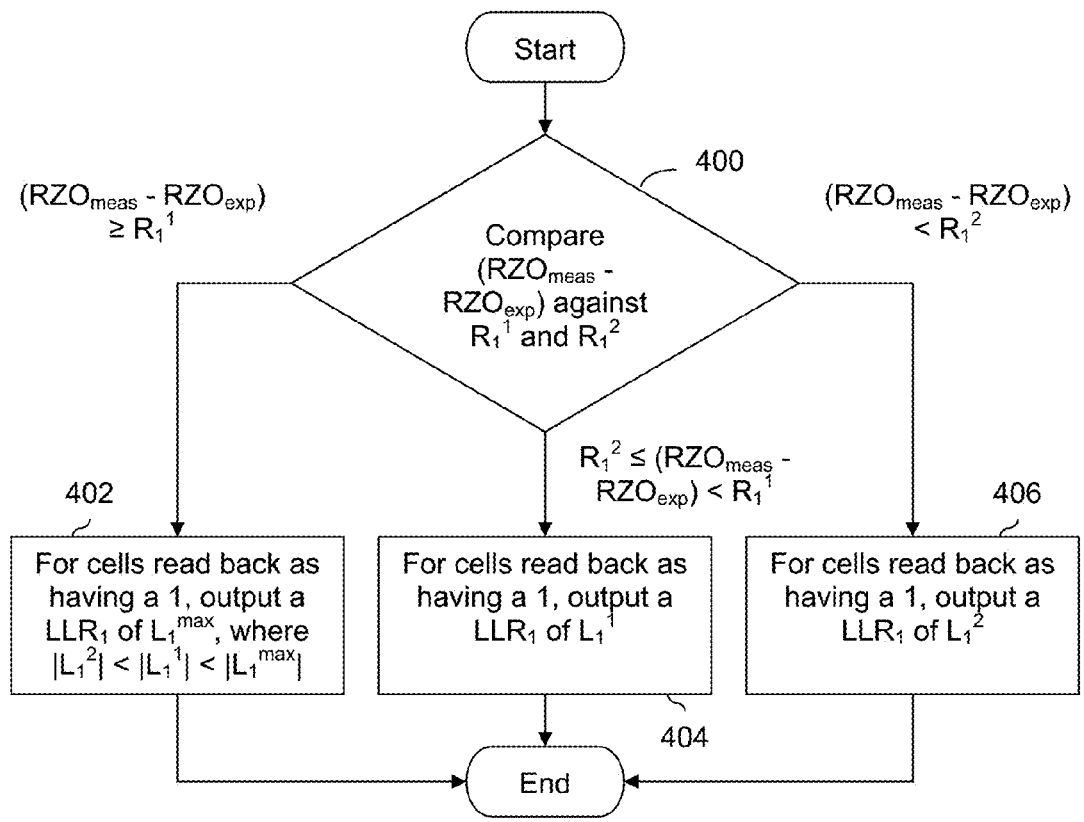
FIG. 4A is a flowchart illustrating an embodiment of a process for selecting one of three possible $LLR_1$ values for cells in a page.

FIG. 4A is a flowchart illustrating an embodiment of a process for selecting one of three possible $LLR_1$ values for cells in a page. In some embodiments, the example process is performed in step 104 in FIG. 1. Although the examples in the two following figures use a ratio of 0s to 1s (i.e., RZO), any expected or measured value may be used (e.g., a number of 0s (i.e., Z), a number of is (i.e., O), or a ratio of is to 0s (i.e., ROZ)).

At step 400, $(RZO_{meas} - R_{ZOexp})$ is compared against $R_1^1$ and $R_1^2$. For example, the values of $R_1^1$ and $R_1^2$ may be predetermined values where $R_1^2 < R_1^1$. The comparison at step 400 has three possible results: $(RZO_{meas} - RZO_{exp}) \geq R_1^1$, $R_1^2 \leq (RZO_{meas} - RZO_{exp}) < R_1^1$, or $(RZO_{meas} - RZO_{exp}) < R_1^2$.

If $(RZO_{meas} - RZO_{exp}) \geq R_1^1$, at step 402, for cells read back as having a 1, a $LLR_1$ of $L_1^{max}$ is output, where $|L_1^2| < |L_1^1| < |L_1^{max}|$. See, for example, the row in Table 2 where $RZO_{exp} < RZO_{meas}$; the rightmost column in that row indicates that a nominal or default magnitude $LLR_1$ value should be increased. In this example, that corresponds to using $L_1^{max}$ since of the three possible $LLR_1$ values (i.e., $L_1^2$, $L_1^1$, or $L_1^{max}$), it has the largest magnitude.

If $R_1^2 \leq (RZO_{meas} - RZO_{exp}) < R_1^1$, at step 404, for cells read back as having a 1, an $LLR_1$ of $L_1^1$ is output. See, for example, the row in Table 2 where $RZO_{exp} \approx RZO_{meas}$. As the rightmost column indicates, there is no change to a nominal or default magnitude for an $LLR_1$ value. When there are three possible $LLR_1$ values (i.e., $L_1^2$, $L_1^1$, or $L_1^{max}$), this corresponds to selecting the one with the medium or middle magnitude, hence the selection of $L_1^1$ in step 404.

If $(RZO_{meas} - RZO_{exp}) < R_1^2$, at step 406, for cells read back as having a 1, a $LLR_1$ of $L_1^2$ is output. In Table 2, for example, this corresponds to the row where $RZO_{exp} > RZO_{meas}$. As the rightmost column in that row indicates, a default or nominal magnitude of an $LLR_1$ value is decreased. Since $L_1^2$ has the smallest magnitude of the three possible $LLR_1$ values, $L_1^2$ is selected at step 406.

Figure 4B:
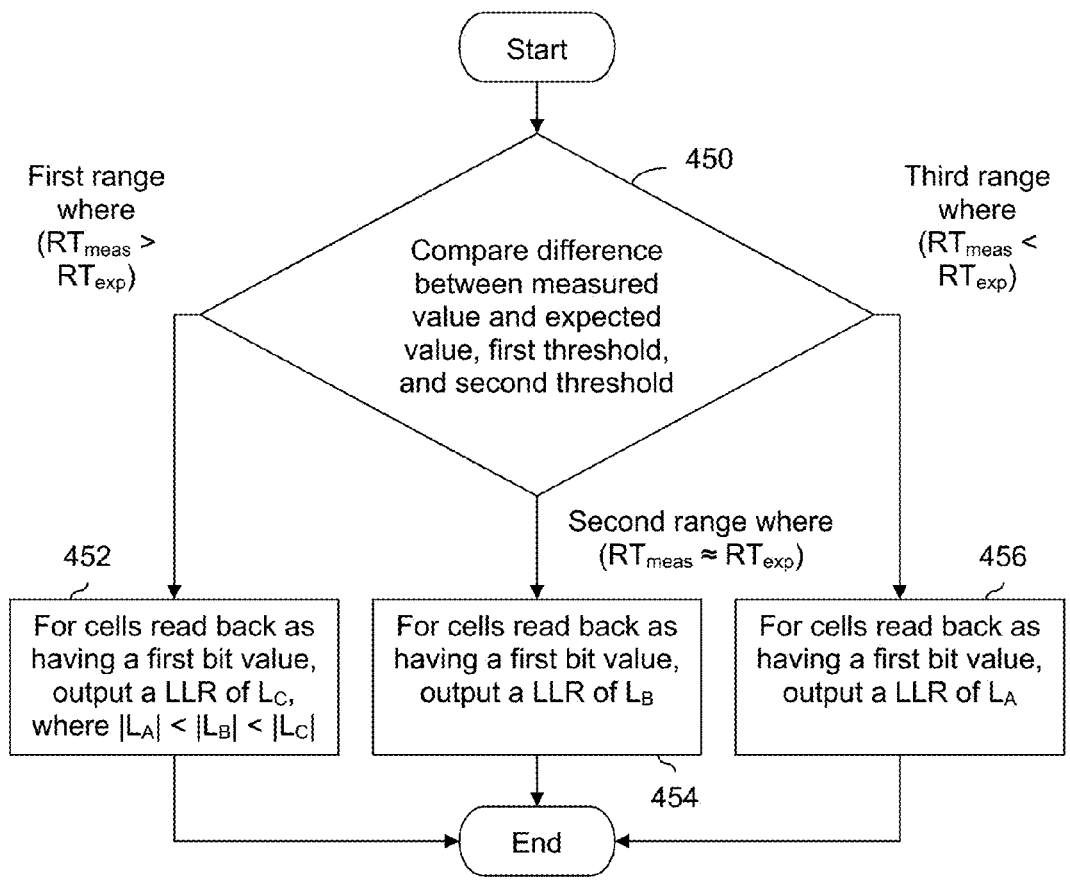
FIG. 4B is a flowchart illustrating an embodiment of a more generalized process for selecting one of three possible LLR values for cells interpreted to have a first bit value.

FIG. 4A is a flowchart that shows specific measured and expected values (i.e., $RZO_{meas}$ and $RZO_{exp}$) and the specific case where a lower range of voltages is associated with a bit value of 1 and an upper range of voltages is associated with a bit value of 0. FIG. 4B is a flowchart illustrating an embodiment of a more generalized process for selecting one of three possible LLR values for cells interpreted to have a first bit value. FIG. 4B shows a more generalized form of FIG. 4A where a lower range of voltages is associated with a first bit value and an upper range of voltages is associated with a second bit value. At step 450, a difference between a measured value and an expected value, a first threshold, and a second threshold are compared. If the comparison corresponds to a first range where a read threshold associated with a measured value is greater than a read threshold associated with an expected value, at step 452, for cells read back as having a first bit value, a LLR of $L_C$ is output, where $|L_A|<|L_B|<|L_C|$. If the comparison at step 450 corresponds to a second range where a read threshold associated with a measured value is approximately equal to a read threshold associated with an expected value, then at step 454, for cells read back as having a first bit value, a LLR of $L_B$ is output. If the comparison at step 450 corresponds to a third range where a read threshold associated with a measured value is less than a read threshold associated with an expected value, for cells read back as having a first bit value, a LLR of $L_A$ is output at step 456.

Figure 5A:
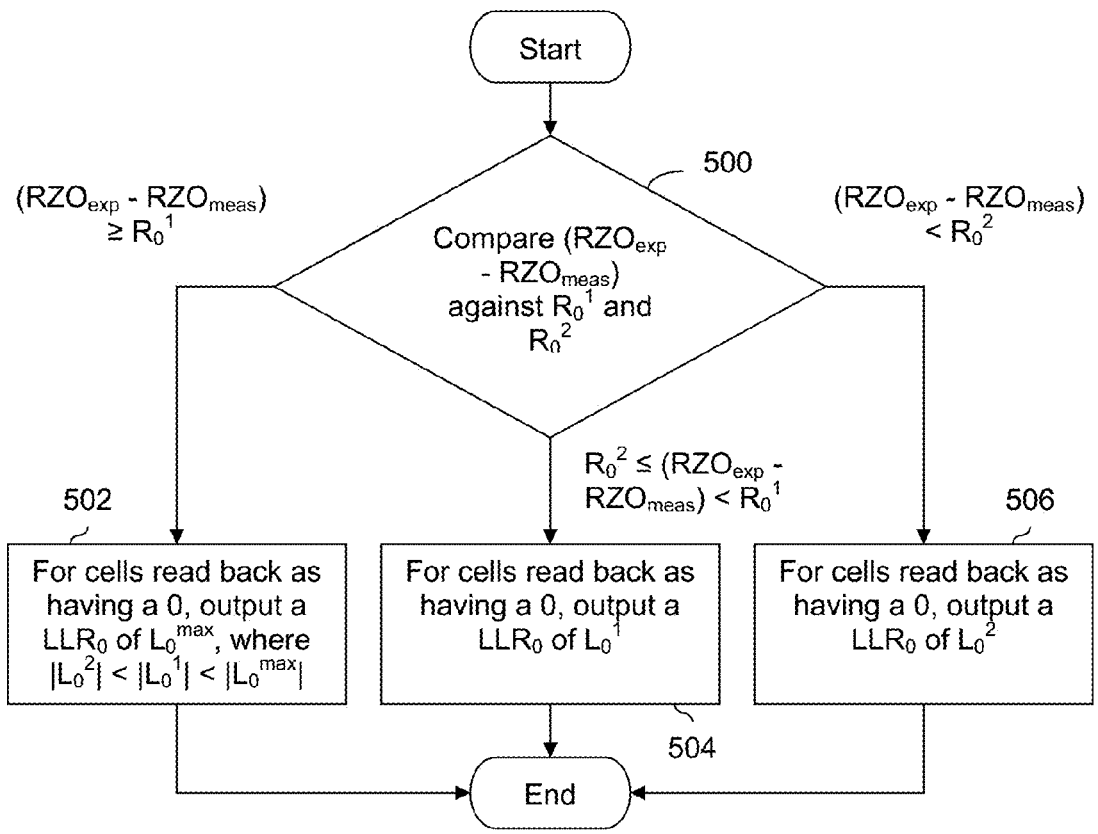
FIG. 5A is a flowchart illustrating an embodiment of a process for selecting one of three possible $LLR_0$ values for cells in a page.

FIG. 5A is a flowchart illustrating an embodiment of a process for selecting one of three possible $LLR_0$ values for cells in a page. FIG. 5A is a counterpart process to FIG. 4A and may be performed with or in parallel to FIG. 4A. In some embodiments, FIG. 5A process is performed in step 104 in FIG. 1.

At step 500, $(RZO_{exp}-RZO_{meas})$ is compared against $R_0^1$ and $R_0^2$. Note that the difference used in step 500 (i.e., $(RZO_{exp}-RZO_{meas})$) will have an opposite sign as the difference used in step 400 in FIG. 4A (i.e., $RZO_{meas}-RZO_{exp}$). As in the previous example, $R_0^1$ and $R_0^2$ may be predetermined values, where $R_0^2<R_0^1$.

If $(RZO_{exp}-RZO_{meas}) \geq R_0^1$, at step 502, for cells read back as having a 0, a $LLR_0$ of $L_0^{max}$ is output, where $|L_0^2|<|L_0^1|<|L_0^{max}|$. In Table 2, for example, this corresponds to the row where $RZO_{exp}>RZO_{meas}$ and, as the rightmost column indicates, a nominal or default magnitude for $LLR_0$ is increased. As a result, since $L_0^{max}$ has the largest magnitude of the three possible $LLR_0$ values, $L_0^{max}$ is selected.

If $R_0^2 \leq (RZO_{exp}-RZO_{meas}) < R_0^1$, at step 504, for cells read back as having a 0, a $LLR_0$ of $L_0^1$ is output. An example of this in Table 2 is $RZO_{exp} \approx RZO_{meas}$ where a nominal or default magnitude of an $LLR_0$ value is not changed. This corresponds to selecting (of three possible $LLR_0$ values), the one with the medium or middle magnitude.

If $(RZO_{exp}-RZO_{meas}) < R_0^2$, at step 506, for cells read back as having a 0, a $LLR_0$ of $L_0^2$ is output. In Table 2, this corresponds to $RZO_{exp}<RZO_{meas}$ and, as indicated in the rightmost column, a nominal or default magnitude is decreased for $LLR_0$. This corresponds to selecting, from three possible $LLR_0$ values, the one having the smallest magnitude (i.e., $L_0^2$).

Figure 5B:
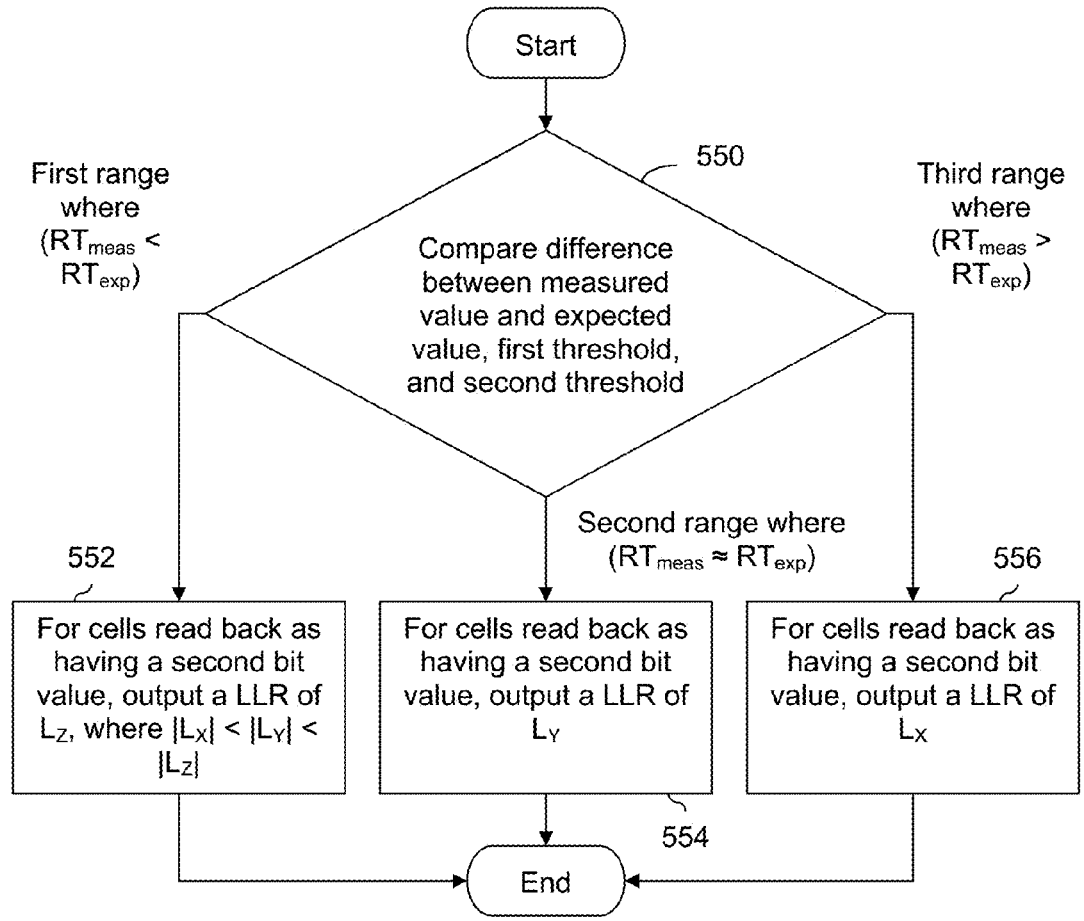
FIG. 5B is a flowchart illustrating an embodiment of a more generalized process for selecting one of three possible LLR values for cells interpreted to have a second bit value.

As with FIG. 4A, a more generalized form of FIG. 5A may be obtained. FIG. 5B is a flowchart illustrating an embodiment of a more generalized process for selecting one of three possible LLR values for cells interpreted to have a second bit value. At step 550, a difference between a measured value and an expected value, a first threshold, and a second threshold are compared. If the comparison corresponds to a first range where a read threshold associated with a measured value is less than a read threshold associated with an expected value, then at step 552, for cells read back as having a second bit value, a LLR of $L_Z$ is output, where $|L_X|<|L_Y|<|L_Z|$. If the comparison at step 550 corresponds to a second range where the read threshold associated with the measured value is approximately equal to the read threshold associated with the expected value, for cells read back as having a second bit value, a LLR of $L_Y$ is output at step 554. If the comparison at step 550 corresponds to a third range where the read threshold associated with the measured value is greater than the read threshold associated with the expected value, at step 556, for cells read back as having a second bit value, a LLR of $L_X$ is output.

Although FIGS. 4A-5B show three possible LLR values/ranges, any number of possible LLR values may be used. For example, additional thresholds (e.g., $R_0^3/R_1^3$, $R_0^4/R_1^4$, etc.) may be used and additional possible LLR values (e.g., $L_0^3/L_1^3$, $L_0^4/L_1^4$, etc.) may be used.

FIGS. 4A-5B show examples where cells which are interpreted to have a given value (e.g., a 0 or a 1) are assigned the same LLR value. In some other embodiments, two cells may be interpreted to have the same value, but are assigned different LLR values. The following figure shows one such embodiment.

Figure 6A:
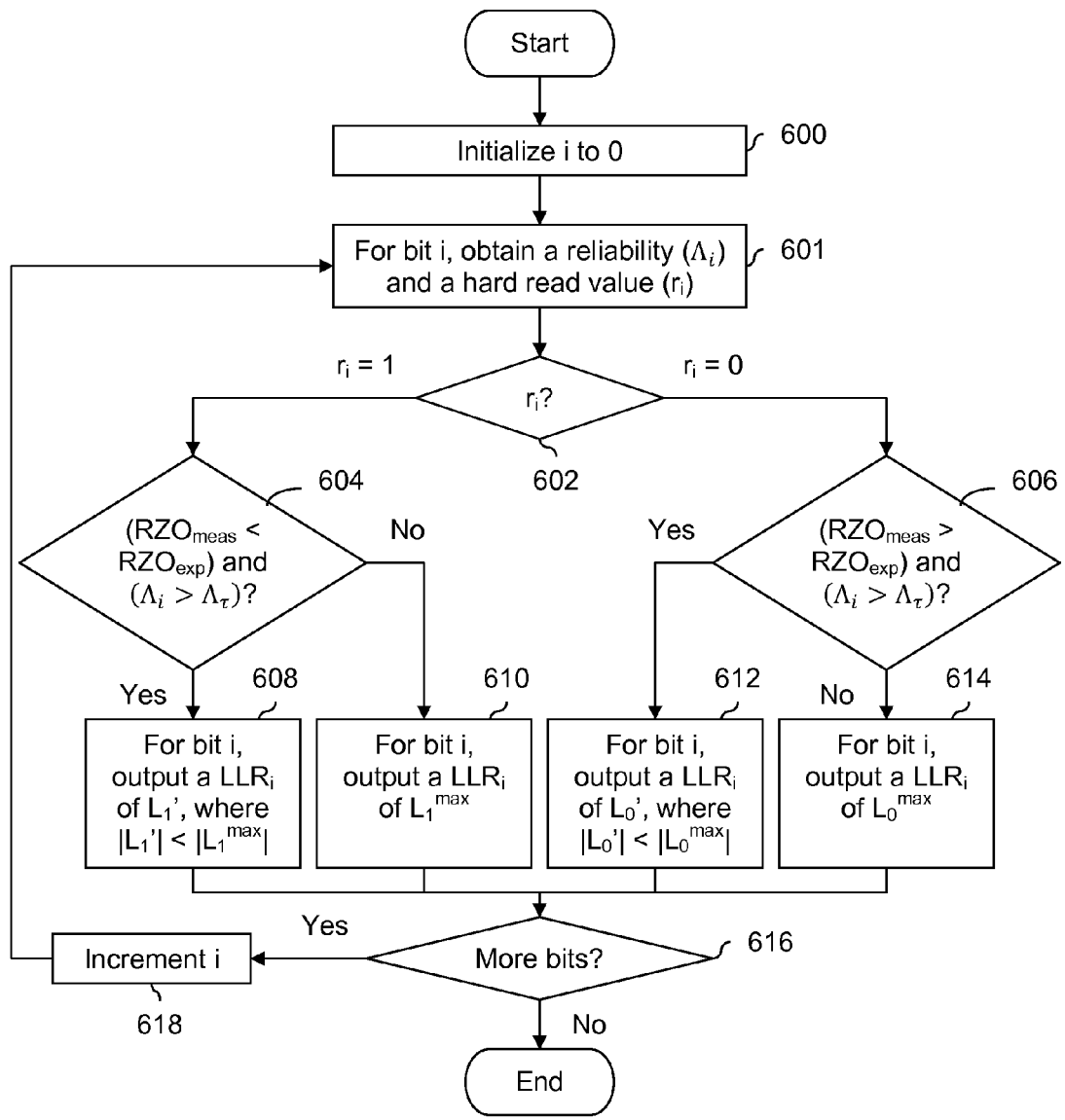
FIG. 6A is a flowchart illustrating an embodiment of a process for determining soft read data based at least in part on an expected value, a measured value, and a reliability.

FIG. 6A is a flowchart illustrating an embodiment of a process for determining soft read data based at least in part on an expected value, a measured value, and a reliability. In some embodiments, the example process is performed at step 104 in FIG. 1.

At step 600, i is initialized to 0. At step 601, for bit i, a reliability $(\nabla_i)$ and a hard read data $(r_i)$ are obtained. For example, the hard read data for that bit may be a 0 or a 1 and the reliability may be obtained from a one-step majority logic decoder, which is a type of low complexity low-density parity-check (LDPC) decoder. For convenience, a brief overview of a one-step majority logic decoder is described herein. Given a LDPC code C with parity check matrix $H=\{h_{i,j}\}$ where $0 \leq i<m$ and $0 \leq j<n$, the following two index sets may be defined: $N_i=\{j: 0 \leq j<n, h_{i,j}=1\}$ and $M_j=\{i: 0 \leq i<m, h_{i,j}=1\}$. For a received hard read sequence $r=\{r_0, \ldots, r_{n-1}\}$ (i.e., where each $r_1$ is either a 0 or a 1), the majority logic decoder creates syndrome sums $$s_i = \sum_{j \in N_i} r_j h_{i,j}$$

for $0 \leq i<m$. For each bit j, the one step majority logic decoder calculates a reliability $$\Lambda_j : \Lambda_j = \sum_{i \in M_j} (2s_i - 1)$$

for $0 \leq j<n$. Using a one-step majority logic decoder is attractive because it uses only combinatorial logic (i.e., it does not include any flip flops or registers), has low complexity, and/or is fast. Other types of decoders which have similar properties (e.g., they use only combinatorial logic, have low complexity and/or are fast) may be used in some other embodiments.

At step 602, the hard read data $(r_1)$ is evaluated. If $r_i=1$, it is determined at step 604 if a measured ratio of 0s to 1s ($RZO_{meas}$) is i less than an expected ratio of 0s to 1s ($RZO_{exp}$) and the reliability for bit i ($\nabla_i$) is greater than a reliability threshold ($\nabla_\tau$). If so, for bit i, a $LLR_i$ of $L_1'$ is output where $|L_1'|<|L_1^{max}|$ at step 608. If at step 604 either ($RZO_{meas} \geq RZO_{exp}$) or ($\nabla_i \leq \nabla_\tau$) then at step 610 for bit i, a $LLR_i$ of $L_1^{max}$ is output.

If at step 602 the hard read data for bit i is 0, then it is determined at step 606 if ($RZO_{meas}>RZO_{exp}$) and ($\nabla_i>\nabla_\tau$). If so, for bit i, a $LLR_i$ of $L_0'$ is output, where $|L_0'|<|L_0^{max}|$, at step 612. If at step 606 either ($RZO_{meas} \leq RZO_{exp}$) or ($\nabla_i \leq \nabla_\tau$) then at step 614 for bit i, a $LLR_i$ of $L_0^{max}$ is output.

After outputting a $LLR_i$ at steps 608, 610, 612, or 614, it is determined at step 616 if there are more bits. For example, if there are n bits indexed from 0 through (n−1) then the decision at step 616 is yes if i<(n−1). If there are more bits, i is incremented at step 618 and the process returns to step 601.

Figure 6B:
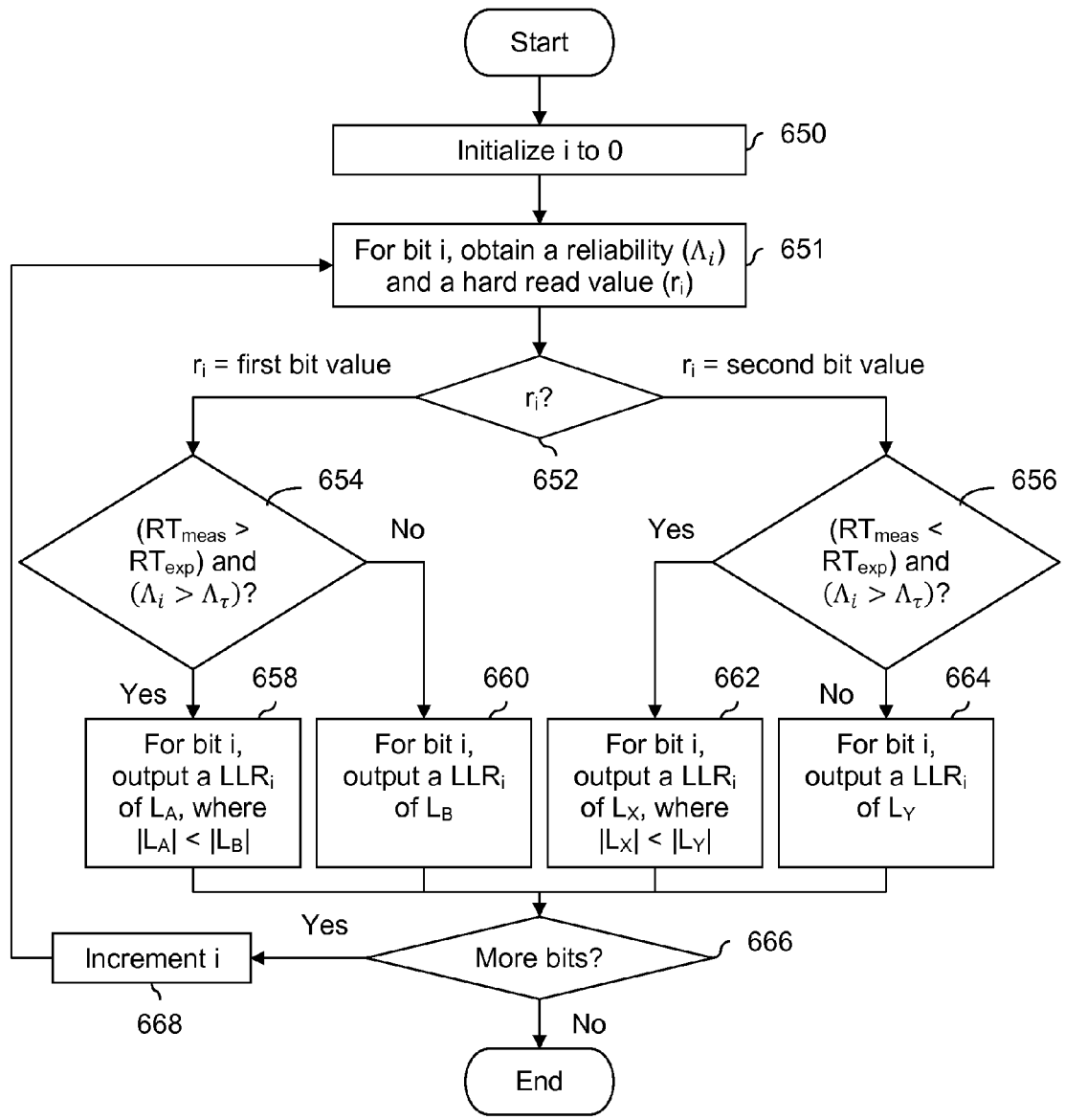
FIG. 6B is a flowchart illustrating an embodiment of a generalized process for determining soft read data based at least in part on an expected value, a measured value, and a reliability.

As with FIGS. 4A and 5A, FIG. 6A may be generalized (e.g., using Table 2) to include other types of measured/expected values (e.g., O, Z, ROZ, etc.) and other bit assignments to voltage ranges. FIG. 6B is a flowchart illustrating an embodiment of a generalized process for determining soft read data based at least in part on an expected value, a measured value, and a reliability. At step 650, i is initialized to 0. At step 651, a reliability and a hard read value are obtained for bit i. At step 652, $r_i$ is evaluated. If $r_i$ is a first bit value, it is determined at step 654 if ($RT_{meas}>RT_{exp}$) and ($\nabla_i>\nabla_\tau$). The ordering or comparison of the read thresholds (i.e., whether $RT_{meas}$ is greater than $RT_{exp}$) may be determined by comparing the expected value and the measured value (e.g., comparing various Z values, O values, RZO values, or ROZ values). If so, for bit i, a $LLR_i$ of $L_A$ is output where $|L_A|<|L_B|$ at step 658. If not, a $LLR_i$ of $L_B$ is output for bit i at step 660. If at step 652 $r_i$ is a second bit value, it is determined at step 656 if ($RT_{meas}<RT_{exp}$) and ($\nabla_i>\nabla_\tau$). If so, for bit i, a $LLR_i$ of $L_X$ is output, where $|L_X|<|L_Y|$ at step 662. If not, at step 664, for bit i, a $LLR_i$ of $L_Y$ is output. After outputting a LLR at steps 658, 660, 662, or 664, it is determined if there are more bits at step 666. If so, i is incremented at step 668 and the process returns to step 651.

Figure 7:
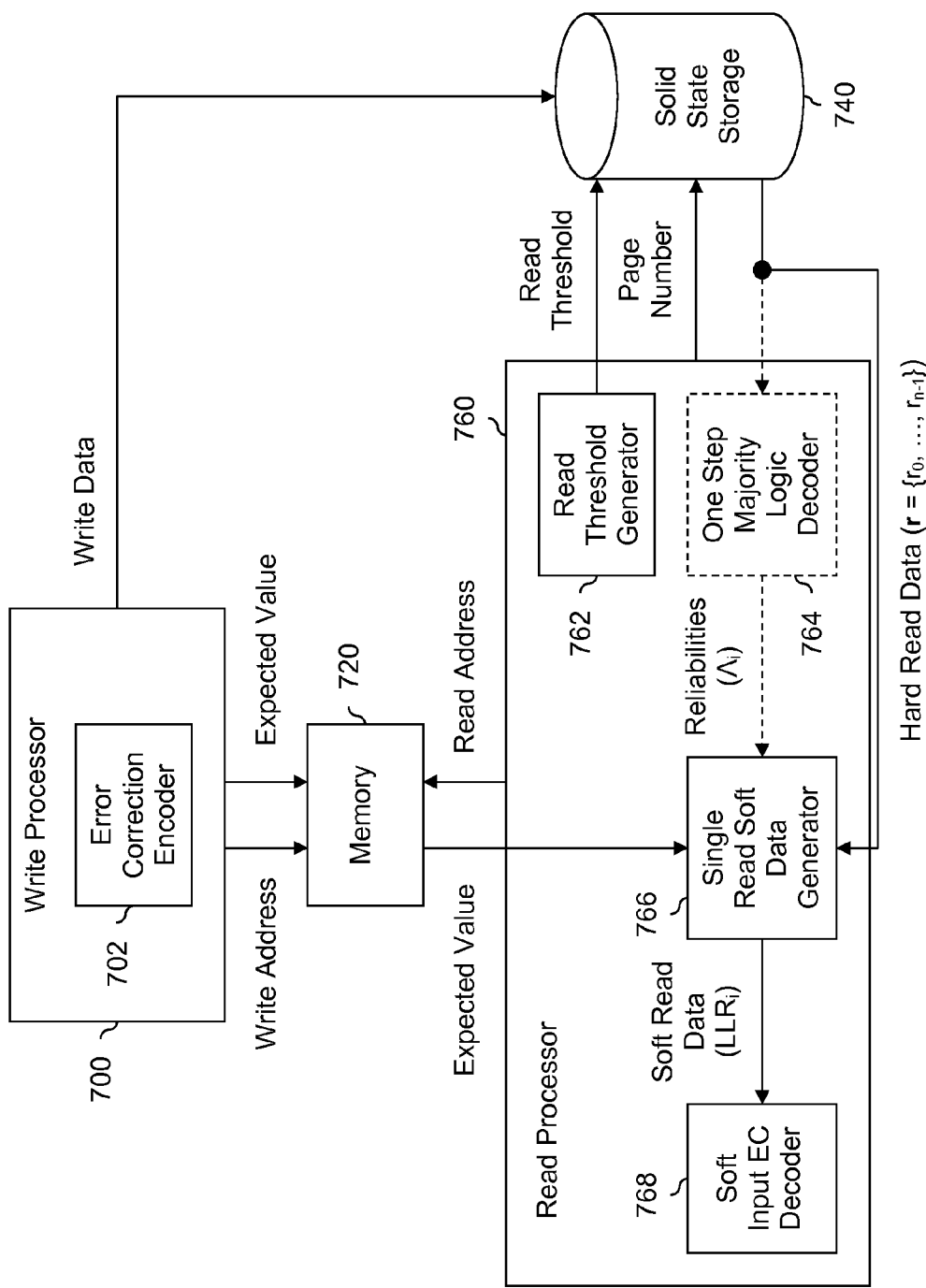
FIG. 7 is a diagram showing an embodiment of a system configured to generate soft read data based at least in part on a measured value and an expected value.

FIG. 7 is a diagram showing an embodiment of a system configured to generate soft read data based at least in part on a measured value and an expected value. In some embodiments, at least some portion of the system shown is implemented on or using a semiconductor device, such as a field-programmable gate array (FPGA) or an application-specific integrated circuit (ASIC). For brevity, some system components unrelated to the technique described herein may not be shown herein.

Write processor 700 generates write data and stores it in solid state storage 740. When writing data to solid state storage 740, write processor stores an expected value which indicates an actual count or ratio of values written to memory 720. In various embodiments, an expected value written to memory 720 includes a number of 0s written, a number of 1s written, a ratio of 0s to 1s written, or a ratio of 1s to 0s written. In some embodiments, read processor 760 will want to know expected values for a given page, and so the expected values are passed to memory 720 with a write address indicating the page which was written.

When a read is performed on solid state storage 740, read threshold generator 762 generates a read threshold which is used to read solid state storage 740. Any appropriate read threshold generation technique may be used and the technique described herein is independent of how a read threshold is generated.

If read processor 760 is configured to perform the processes of FIG. 4A, 4B, 5A, or 5B, then it is not necessary to have one step majority logic decoder 764 and the hard read data is passed to single read soft data generator 766. The hard read data is used by single read soft data generator 766 to generate a measured value representative of stored values for a desired page. The expected value is passed from memory 720 to single read soft data generator 766 when the desired read address (e.g., a page number) is specified. Single read soft data generator 766 uses the expected value and measured value to perform the process of FIG. 4A, 4B, 5A, or 5B and outputs soft read data. The soft read data may be passed to soft input error correction decoder 768 which corresponds to error correction encoder 702 in write processor 700. In some embodiments, error correction encoder 702 is an LDPC encoder and soft input error correction decoder 768 is an LDPC decoder.

If read processor 760 is configured to perform the processes of FIG. 6A or 6B, then one step majority logic decoder 764 generates reliabilities using the hard read data from solid state storage 740. The hard read data is also passed to single read soft data generator 766 which generates a measured value (e.g., a ratio of 0s to 1s read from storage 740, a ratio of 1s to 0s read from storage 740, a number of 1s read from storage 740, or a number of 0s read from storage 740) from the hard read data. Single read soft data generator 766 then generates a soft read data according the process of FIG. 6A or 6B using the expected value from memory 720, the reliabilities from one step majority logic decoder 764, and the measured value generated from the hard read data from solid state storage 740. The soft read data is passed from single read soft data generator 766 to soft input error correction decoder 768.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   obtaining an expected value representative of a plurality of stored values in a group of cells;
   obtaining a measured value representative of the plurality of stored values in the group of cells based on a single read to the group of cells; and
   using a processor to determine soft read data for the group of cells based at least in part on the expected value and the measured value, including by:
      comparing: (1) a difference between the measured value and the expected value, (2) a first threshold, and (3) a second threshold, wherein:
         a first bit value is associated with a lower range of voltages; and
         a second bit value is associated with an upper range of voltages;
      in the event the comparison corresponds to a first range associated with a read threshold associated with the measured value being greater than a read threshold associated with the expected value:
         for cells read back as having the first bit value, outputting a log likelihood value (LLR) of $L_C$, where $|L_A|<|L_B|<|L_C|$; and
         for cells read back as having the second bit value, outputting a LLR of $L_X$, where $|L_X|<|L_Y|<|L_Z|$;
      in the event the comparison corresponds to a second range associated with the read threshold associated with the measured value being equal to the read threshold associated with the expected value:
         for cells read back as having the first bit value, outputting a LLR of $L_B$, where $|L_A|<|L_B|<|L_C|$; and for cells read back as having the second bit value, outputting a LLR of $L_Y$, where $|L_X|<|L_Y|<|L_Z|$; and in the event the comparison corresponds to a third range associated with the read threshold associated with the measured value being less than the read threshold associated with the expected value:

for cells read back as having the first bit value, outputting a LLR of $L_A$, where $|L_A|<|L_B|<|L_C|$; and for cells read back as having the second bit value, outputting a LLR of $L_Z$, where $|L_X|<|L_Y|<|L_Z|$.

2. The method of claim 1, wherein:
the expected value includes one or more of the following: a number of 0s written, a number of 1s written, a ratio of 0s to 1s written, or a ratio of 1s to 0s written; and
the measured value includes one or more of the following: a number of 0s read, a number of 1s read, a ratio of 0s to 1s read, or a ratio of 1s to 0s read.

3. The method of claim 1, wherein the method is performed by a semiconductor device, including one or more of the following: a field-programmable gate array (FPGA) or an application-specific integrated circuit (ASIC).

4. A method, comprising:
obtaining an expected value representative of a plurality of stored values in a group of cells;
obtaining a measured value representative of the plurality of stored values in the group of cells based on a single read to the group of cells;
using a one-step majority logic decoder to obtain a reliability for bit i; and
using a processor to determine soft read data for the group of cells based at least in part on the expected value, the measured value, the reliability for bit i, a hard read value for bit i, and a threshold reliability, including by:
comparing the expected value and the measured value;
comparing the threshold reliability and the reliability for bit i, wherein:
a first bit value is associated with a lower range of voltages; and
a second bit value is associated with an upper range of voltages;
in the event the hard read value for bit i is the first bit value:
in the event (1) the comparison of the expected value and the measured value corresponds to a read threshold associated with the measured value being greater than a read threshold associated with the expected value and (2) the reliability for bit i is greater than the threshold reliability, outputting a log-likelihood ratio (LLR) of $L_A$, where $|L_A|<|L_B|$; and
otherwise, outputting a LLR of $L_B$; and
in the event the hard read value for bit i is the second bit value:
in the event (1) the comparison of the expected value and the measured value corresponds to a read threshold associated with the measured value being less than a read threshold associated with the expected value and (2) the reliability for bit i is greater than the threshold reliability, outputting a log-likelihood ratio (LLR) of $L_X$, where $|L_X|<|L_Y|$; and
otherwise, outputting a LLR of $L_Y$.

5. The method of claim 4, wherein:
the expected value includes one or more of the following: a number of 0s written, a number of 1s written, a ratio of 0s to 1s written, or a ratio of 1s to 0s written; and
the measured value includes one or more of the following: a number of 0s read, a number of 1s read, a ratio of 0s to 1s read, or a ratio of 1s to 0s read.

6. The method of claim 4, wherein the method is performed by a semiconductor device, including one or more of the following: a field-programmable gate array (FPGA) or an application-specific integrated circuit (ASIC).

7. A system, comprising:
a memory; and
a single read soft data generator configured to:
obtain, from the memory, an expected value representative of a plurality of stored values in a group of cells;
obtain a measured value representative of the plurality of stored values in the group of cells based on a single read to the group of cells; and
determine soft read data for the group of cells based at least in part on the expected value and the measured value, including by:
comparing: (1) a difference between the measured value and the expected value, (2) a first threshold, and (3) a second threshold, wherein:
a first bit value is associated with a lower range of voltages; and
a second bit value is associated with an upper range of voltages;
in the event the comparison corresponds to a first range associated with a read threshold associated with the measured value being greater than a read threshold associated with the expected value:
for cells read back as having the first bit value, outputting a log likelihood value (LLR) of $L_C$, where $|L_A|<|L_B|<|L_C|$; and
for cells read back as having the second bit value, outputting a LLR of $L_X$, where $|L_X|<|L_Y|<|L_Z|$;
in the event the comparison corresponds to a second range associated with the read threshold associated with the measured value being equal to the read threshold associated with the expected value:
for cells read back as having the first bit value, outputting a LLR of $L_B$, where $|L_A|<|L_B|<L_C|$; and
for cells read back as having the second bit value, outputting a LLR of $L_Y$, where $|L_X|<L_Y|<|L_Z|$; and
in the event the comparison corresponds to a third range associated with the read threshold associated with the measured value being less than the read threshold associated with the expected value:
for cells read back as having the first bit value, outputting a LLR of $L_A$, where $|L_A|<|L_B|<|L_C|$; and
for cells read back as having the second bit value, outputting a LLR of $L_Z$, where $|L_X|<|L_Y|<|L_Z|$.

8. The system of claim 7, wherein:
the expected value includes one or more of the following: a number of 0s written, a number of 1s written, a ratio of 0s to 1s written, or a ratio of 1s to 0s written; and
the measured value includes one or more of the following: a number of 0s read, a number of 1s read, a ratio of 0s to 1s read, or a ratio of 1s to 0s read.

9. The system of claim 7, wherein the system is implemented using a semiconductor device, including one or more of the following: a field-programmable gate array (FPGA) or an application-specific integrated circuit (ASIC).

10. A system, comprising:
a memory;

a one-step majority logic decoder configured to obtain a reliability for bit i; and
a single read soft data generator configured to:
obtain, from the memory, an expected value representative of a plurality of stored values in a group of cells;
obtain a measured value representative of the plurality of stored values in the group of cells based on a single read to the group of cells; and
determine soft read data for the group of cells based at least in part on the expected value, the measured value, the reliability for bit i, a hard read value for bit i, and a threshold reliability, including by:
comparing the expected value and the measured value;
comparing the threshold reliability and the reliability for bit i, wherein:
a first bit value is associated with a lower range of voltages; and
a second bit value is associated with an upper range of voltages;
in the event the hard read value for bit i is the first bit value:
in the event (1) the comparison of the expected value and the measured value corresponds to a read threshold associated with the measured value being greater than a read threshold associated with the expected value and (2) the reliability for bit i is greater than the threshold reliability, outputting a log-likelihood ratio (LLR) of $L_A$, where $|L_A|<|L_B|$; and
otherwise, outputting a LLR of $L_B$; and
in the event the hard read value for bit i is the second bit value:
in the event (1) the comparison of the expected value and the measured value corresponds to a read threshold associated with the measured value being less than a read threshold associated with the expected value and (2) the reliability for bit i is greater than the threshold reliability, outputting a log-likelihood ratio (LLR) of $L_X$, where $|L_X|<|L_Y|$; and
otherwise, outputting a LLR of $L_Y$.

11. The system of claim 10, wherein:
the expected value includes one or more of the following: a number of 0s written, a number of 1s written, a ratio of 0s to 1s written, or a ratio of 1s to 0s written; and
the measured value includes one or more of the following: a number of 0s read, a number of 1s read, a ratio of 0s to 1s read, or a ratio of 1s to 0s read.

12. The system of claim 10, wherein the system is implemented using a semiconductor device, including one or more of the following: a field-programmable gate array (FPGA) or an application-specific integrated circuit (ASIC).

13. A computer program product, the computer program product being embodied in a non-transitory computer readable storage medium and comprising computer instructions for:
obtaining an expected value representative of a plurality of stored values in a group of cells;
obtaining a measured value representative of the plurality of stored values in the group of cells based on a single read to the group of cells; and
determining soft read data for the group of cells based at least in part on the expected value and the measured value, including by:
comparing (1) a difference between the measured value and the expected value, (2) a first threshold, and (3) a second threshold, wherein:
a first bit value is associated with a lower range of voltages; and
a second bit value is associated with an upper range of voltages;
in the event the comparison corresponds to a first range associated with a read threshold associated with the measured value being greater than a read threshold associated with the expected value:
for cells read back as having the first bit value, outputting a log likelihood value (LLR) of $L_C$, where $|L_A|<|L_B|<|L_C|$; and
for cells read back as having the second bit value, outputting a LLR of $L_X$, where $|L_X|<|L_Y|<|L_Z|$;
in the event the comparison corresponds to a second range associated with the read threshold associated with the measured value being equal to the read threshold associated with the expected value:
for cells read back as having the first bit value, outputting a LLR of $L_B$, where $|L_A|<|L_B|<|L_C|$; and
for cells read back as having the second bit value, outputting a LLR of $L_Y$, where $|L_X|<|L_Y|<|L_Z|$; and
in the event the comparison corresponds to a third range associated with the read threshold associated with the measured value being less than the read threshold associated with the expected value:
for cells read back as having the first bit value, outputting a LLR of $L_A$, where $|L_A|<|L_B|<|L_C|$; and
for cells read back as having the second bit value, outputting a LLR of $L_Z$, where $|L_X|<|L_Y|<|L_Z|$.

14. The computer program product of claim 13, wherein:
the expected value includes one or more of the following: a number of 0s written, a number of 1s written, a ratio of 0s to 1s written, or a ratio of 1s to 0s written; and
the measured value includes one or more of the following: a number of 0s read, a number of 1s read, a ratio of 0s to 1s read, or a ratio of 1s to 0s read.

15. A computer program product, the computer program product being embodied in a non-transitory computer readable storage medium and comprising computer instructions for:
obtaining an expected value representative of a plurality of stored values in a group of cells;
obtaining a measured value representative of the plurality of stored values in the group of cells based on a single read to the group of cells;
using a one-step majority logic decoder to obtain a reliability for bit i; and
determining soft read data for the group of cells based at least in part on the expected value, the measured value, the reliability for bit i, a hard read value for bit i, and a threshold reliability, including by:
comparing the expected value and the measured value;
comparing the threshold reliability and the reliability for bit i, wherein:
a first bit value is associated with a lower range of voltages; and
a second bit value is associated with an upper range of voltages;
in the event the hard read value for bit i is the first bit value:
in the event (1) the comparison of the expected value and the measured value corresponds to a read threshold associated with the measured value being greater than a read threshold associated with the expected value and (2) the reliability for bit i is greater than the threshold reliability, outputting a log-likelihood ratio (LLR) of $L_A$, where $|L_A|<|L_B|$; and otherwise, outputting a LLR of $L_B$; and in the event the hard read value for bit i is the second bit value:

in the event (1) the comparison of the expected value and the measured value corresponds to a read threshold associated with the measured value being less than a read threshold associated with the expected value and (2) the reliability for bit i is greater than the threshold reliability, outputting a log-likelihood ratio (LLR) of $L_X$, where $|L_X|<|L_Y|$; and otherwise, outputting a LLR of LY.

16. The computer program product of claim 15, wherein:

the expected value includes one or more of the following: a number of 0s written, a number of 1s written, a ratio of 0s to 1s written, or a ratio of 1s to 0s written; and the measured value includes one or more of the following: a number of 0s read, a number of 1s read, a ratio of 0s to 1s read, or a ratio of 1s to 0s read.

* * * * *